(12) United States Patent
Lin et al.

(10) Patent No.: US 9,905,562 B2
(45) Date of Patent: Feb. 27, 2018

(54) SEMICONDUCTOR INTEGRATED CIRCUIT LAYOUT STRUCTURE

(71) Applicant: UNITED MICROELECTRONICS CORP., Hsin-Chu (TW)

(72) Inventors: Shih-Chin Lin, Hsinchu County (TW); Kuei-Chun Hung, Hsinchu (TW); Jerry Che Jen Hu, Taipei (TW); Ming-Jui Chen, Tainan (TW); Chen-Hsien Hsu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/484,126

(22) Filed: Apr. 10, 2017

(65) Prior Publication Data

US 2017/0221897 A1 Aug. 3, 2017

Related U.S. Application Data

(62) Division of application No. 14/859,367, filed on Sep. 21, 2015, now Pat. No. 9,673,145.

(Continued)

(30) Foreign Application Priority Data

Aug. 6, 2015 (TW) ............... 104125572 A

(51) Int. Cl.
*H01L 27/118* (2006.01)
*H01L 27/092* (2006.01)
(Continued)

(52) U.S. Cl.
CPC ........ *H01L 27/0924* (2013.01); *H01L 23/528* (2013.01); *H01L 23/5226* (2013.01);
(Continued)

(58) Field of Classification Search
CPC ............. H01L 27/0924; H01L 27/0207; H01L 29/0649; H01L 27/0886; H01L 23/5226;
(Continued)

(56) References Cited

U.S. PATENT DOCUMENTS 7,737,554 B2 6/2010 Xu
8,399,931 B2 3/2013 Liaw
(Continued)

*Primary Examiner* — Thinh T Nguyen
(74) *Attorney, Agent, or Firm* — Winston Hsu

(57) ABSTRACT

A semiconductor IC layout structure includes a plurality of first active regions arranged along a second direction, a plurality of second active regions arranged along the second direction, a plurality of gate structures extending along a first direction and respectively straddling the first active regions and the second active regions, a plurality of first conductive structures extending along the first direction, and a plurality of second conductive structures formed on the gate structures. The second active regions are isolated from the first active regions. The first direction is perpendicular to the second direction. The first conductive structures are formed on the first active regions and the second active regions. The second conductive structures include a plurality of slot-type second conductive structures extended along the second direction and a plurality of island-type second conductive structures formed on the gate structures.

6 Claims, 10 Drawing Sheets

Related U.S. Application Data

(60) Provisional application No. 62/158,534, filed on May 7, 2015.

(51) Int. Cl.
| | |
|---|---|
| *H01L 27/02* | (2006.01) |
| *H01L 29/06* | (2006.01) |
| *H01L 27/088* | (2006.01) |
| *H01L 23/522* | (2006.01) |
| *H01L 23/528* | (2006.01) |
| *H01L 21/285* | (2006.01) |
| *H01L 21/8238* | (2006.01) |
| *H01L 29/49* | (2006.01) |

(52) U.S. Cl.
CPC ...... *H01L 27/0207* (2013.01); *H01L 27/0886* (2013.01); *H01L 29/0649* (2013.01); *H01L 21/28518* (2013.01); *H01L 21/823871* (2013.01); *H01L 29/4983* (2013.01)

(58) Field of Classification Search
CPC . H01L 23/528; H01L 29/518; H01L 29/4983; H01L 29/4975; H01L 29/42364; H01L 21/823871; H01L 21/28518; H01L 27/92
USPC ........ 257/206, 392, 393, 401, 369, E21.632; 438/128, 129, 217, 276; 365/154, 156
See application file for complete search history.

(56) References Cited

U.S. PATENT DOCUMENTS

| | | | |
|---|---|---|---|
| 8,728,892 | B2 | 5/2014 | Ou et al. |
| 8,799,847 | B1 | 8/2014 | Song et al. |
| 9,099,447 | B2 * | 8/2015 | Tamaru ............. H01L 21/76895 |
| 9,117,882 | B2 | 8/2015 | Lu |
| 2001/0017418 | A1 | 8/2001 | Noguchi |
| 2002/0036354 | A1 | 3/2002 | Yamaguchi |
| 2005/0077550 | A1 | 4/2005 | Inaba |
| 2007/0228419 | A1 * | 10/2007 | Komaki ............. H01L 27/0207 257/202 |
| 2012/0280287 | A1 * | 11/2012 | Hou .................... H01L 27/0207 257/288 |
| 2013/0113112 | A1 * | 5/2013 | Tamaru ............. H01L 21/76895 257/774 |
| 2013/0235652 | A1 | 9/2013 | Liaw |
| 2014/0339647 | A1 | 11/2014 | Rashed |
| 2016/0049395 | A1 | 2/2016 | Okagaki |
| 2016/0086863 | A1 | 3/2016 | Won |

\* cited by examiner

SEMICONDUCTOR INTEGRATED CIRCUIT LAYOUT STRUCTURE

CROSS REFERENCE TO RELATED APPLICATIONS

This application is a division of U.S. patent application Ser. No. 14/859,367 filed Sep. 21, 2015, which claims priority of U.S. Provisional Patent Application Ser. No. 62/158,534 filed May 7, 2015, which are incorporated herein by reference in its entirety.

BACKGROUND OF THE INVENTION

1. Field of the Invention

The present invention relates to semiconductor integrated circuit (hereinafter abbreviated as IC) structures, and more particularly, to semiconductor IC structures of inverter (hereinafter abbreviated as INV), 2-input not- and gate (2-input NAND, hereinafter abbreviated as ND2) and 2-input exclusive- or gate (hereinafter abbreviated as XOR2).

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For these purposes, in conventional semiconductor techniques, a mask layer is formed on the material substrate/layers, and these tiny elements are defined in the mask layer and followed by being transferred to the objective material substrate/layers. Generally, the mask layer may include or is formed by means of a layer of photoresist that is patterned by lithographic process and/or patterned hard mask including the patterns transferred from the patterned photoresist. Since the dimensions of the patterns in sophisticated ICs are steadily decreasing, the equipment used for patterning devices features have to meet very stringent requirements with regard to resolution and overlay accuracy of the involved fabrication processes. In this respect, resolution is taken as a measure specifying the consistent ability to print minimum images under conditions of predefined manufacturing variations.

As feature sizes are decreased under 85 nanometers (hereinafter abbreviated as nm), the existing single patterning process has met its bottleneck to successfully render the features. In order to push the lithographic limit further and to create even smaller, more densely packed devices, multiple patterning technology such as double patterning process, are being developed with presently available manufacturing equipment. Typically, the multiple patterning technologies are to decompose dense layout patterns into sub-patterns and then use two or more masks to print each sub-pattern. By transferring the sub-patterns to the photoresist layer/mask layer, the wanted patterns are re-constructed and obtained.

It is found that the multiple patterning technology gives rise to process control challenges. Thus, process complexity and process cost are unavoidably increased with the involvement of the multiple patterning technology.

More important, the ICs have been one of the most important hardware used in the modern information society, and the ICs having complex functions are made up of many standard cells, each with basic functions. Since those standard cells are essential elements for the ICs, layout structures of those standard cells enormously affect the whole layout structure of the ICs. It is therefore always in need to provide semiconductor IC structure(s) that is able to improve process yield and to reduce process complexity.

SUMMARY OF THE INVENTION

According to an aspect of the present invention, a semiconductor IC layout structure is provided. The semiconductor IC layout structure includes a first active region, a second active region isolated from the first active region, a gate structure extending along a first direction and straddling the first active region and the second active region, and a plurality of conductive structures. The first active region at two opposite sides of the gate structure respectively forms a first source region and a first drain region, and the second active region at the two opposite sides of the gate structure respectively forms a second source region and a second drain region. The conductive structures include a plurality of slot-type conductive structures and one island-type conductive structure. The island-type conductive structure is formed on the gate structure, and the slot-type conductive structures are respectively formed on the first source region, the first drain region, the second source region, and the second drain region.

According to another aspect of the present invention, a semiconductor IC layout structure is provided. The IC layout structure includes a first active region, a second active region isolated from the first active region, a first gate structure extending along a first direction and straddling the first active region and the second active region, a second gate structure extending along the first direction and straddling the first active region and the second active region, a plurality of first conductive structures, two second conductive structures, a plurality of via structures, a plurality of first wire structures, and at least a second wire structure. The first conductive structures are formed on the first active region and the second active region at two opposite sides of the first gate structure, and on the first active region and the second active region at two opposite sides of the second gate structure. The second conductive structures are respectively formed on the first gate structure and the second gate structure. The via structures are formed on the first conductive structures and the second conductive structures. The first wire structures respectively include a first portion and the first portions extending along the first direction. The second wire structure includes a first portion extending the first direction and a second portion extending along a second direction. The second direction is perpendicular to the first direction.

According to still another aspect of the present invention, a semiconductor IC layout structure is provided. The semiconductor IC layout structure includes a plurality of first active regions arranged along a second direction, a plurality of second active regions arranged along the second direction, a plurality of gate structures extending along a first direction and respectively straddling the first active regions and the second active regions, a plurality of first conductive structures extending along the first direction, and a plurality of second conductive structures formed on the gate structures. The second active regions are isolated from the first active regions. The first direction is perpendicular to the second direction. The first conductive structures are formed on the first active regions and the second active regions. The second conductive structures further include a plurality of slot-type second conductive structures and a plurality of island-type second conductive structures. The island-type second conductive structures are formed on the gate structures and the slot-type second conductive structures are extended along the second direction.

According to the present invention, a semiconductor INV layout structure, a semiconductor ND2 layout structure and a semiconductor XOR2 layout structure are respectively provided. In the semiconductor INV layout structure, the slot-type conductive structures and the island-type conductive structure are formed in one same layer. The slot-type conductive structures construct electrical connections between the sources/drains and other devices while the island-type conductive structure constructs electrical connection between the gate structure and other devices. By providing the slot-type conductive structures and the island-type conductive structure in one single layer, the present invention provides a semiconductor INV layout structure including a simplified layout design without affecting the required electrical connections, and thus fabrication for the semiconductor INV layout structure is improved. In the semiconductor ND2 layout structure provided by the present invention, the first wire structures extending along one direction and the second wire structures extending along at least two directions are formed in one same layer. By providing the first wire structures and the second wire structure in one single layer, the present invention provides a semiconductor ND2 layout structure including a simplified layout design without affecting the required electrical connections, and thus fabrication for the semiconductor ND2 layout structure is improved. In the semiconductor XOR2 layout structure provided by the present invention, the first conductive structures and the second conductive structures are formed in one same layer. An extending direction of the first conductive structures is parallel with an extending direction of the gate structures. The second conductive structures further include the island-type conductive structures and the slot-type conductive structures perpendicular to the gate structures. By providing the conductive structures including two extending directions perpendicular to each other and the island-type conductive structures formed in one single layer, the present invention provides a semiconductor XOR2 layout structure including a simplified layout design without affecting the required electrical connections, and thus fabrication for the semiconductor XOR2 layout structure is improved.

These and other objectives of the present invention will no doubt become obvious to those of ordinary skill in the art after reading the following detailed description of the preferred embodiment that is illustrated in the various figures and drawings.

DETAILED DESCRIPTION

It will be understood that, although the terms, first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could termed a second element, component, region, layer or section without departing from the teachings of the present invention. And it is noted that the drawings are provided for illustrative purposes, and as such, they are not to drawn to scale.

Figure 1:
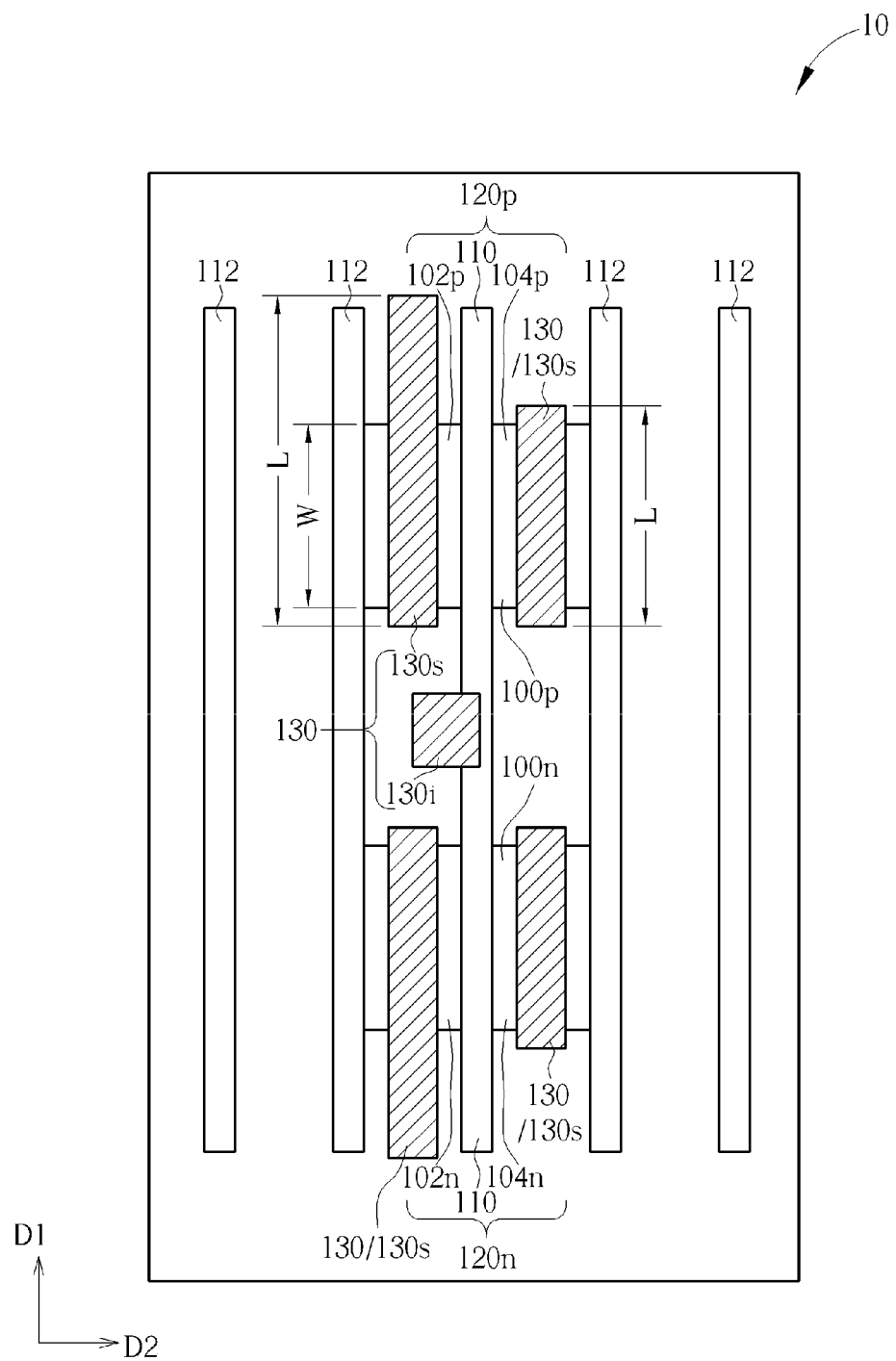
FIG. 1 is a schematic drawing of a portion of a semiconductor INV layout structure provided by a preferred embodiment of the present invention.
Figure 2:
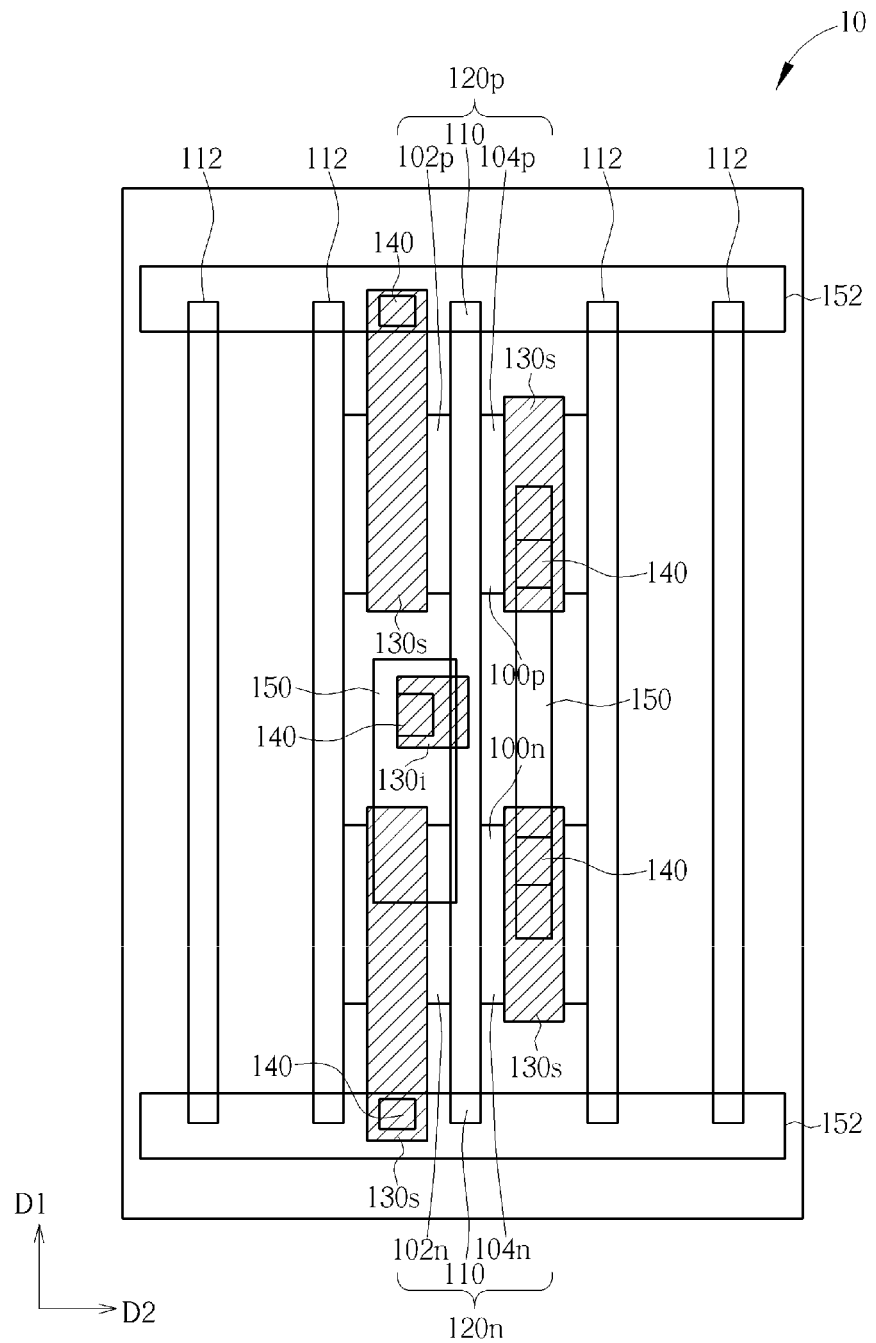
FIG. 2 is a schematic drawing of the semiconductor INV layout structure provided by the preferred embodiment of the present invention.
Figure 3:
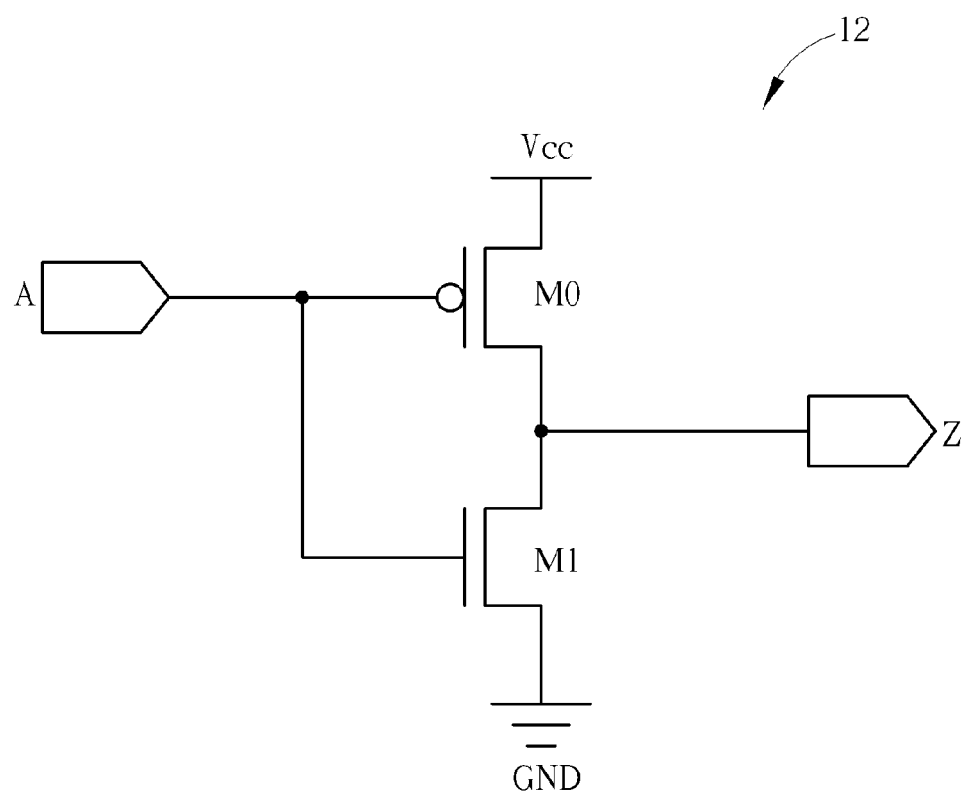
FIG. 3 is a circuit diagram of an INV circuit provided by the present invention.

Please refer to FIGS. 1-3, FIG. 1 is a schematic drawing of a portion of a semiconductor INV layout structure provided by a preferred embodiment of the present invention, FIG. 2 is a schematic drawing of the semiconductor INV layout structure provided by the preferred embodiment of the present invention, and FIG. 3 is a circuit diagram of an INV circuit provided by the present invention. In order to clearly describe the layout structure of the preferred embodiment FIG. 1 and FIG. 2 should be referred together. As shown in FIG. 1 and FIG. 2, a semiconductor INV layout structure 10 provided by the preferred embodiment includes a first active region 100$p$ and a second active region 100$n$. The first active region 100$p$ and the second active region 100$n$ are complementary to each other. For example but not limited to, the first active region 100$p$ is a p-typed region and the second active region 100$n$ is an n-typed region in the preferred embodiment. Additionally, an n-well can be formed in the p-typed first active region 100$p$ while a p-well can be formed in the n-typed second active region 100$n$ if required. Furthermore, the first active region 100$p$, the second active region 100$n$, the n-well, and the p-well can be formed in a semiconductor substrate (not shown), however those details are omitted herein. As shown in FIG. 1 and FIG. 2, the first active region 100$p$ is physically spaced apart and isolated from the second active region 100$n$. The semiconductor INV layout structure 10 includes a gate structure 110 formed on the semiconductor substrate. The gate structure 110 includes at least a gate dielectric layer (not shown) and a gate conductive layer (not shown). As shown in FIG. 1, the gate structure 110 extends along a first direction D1 and straddles the first active region 100$p$ and the second active region 100$n$. Therefore, the first active region 100$p$ at two opposite sides of the gate structure 110 respectively forms a first source region 102$p$ and a first drain region 104$p$, and the second active region 100$n$ at the two opposite sides of the gate structure 110 respectively forms a second source region 102$n$ and a second drain region 104$n$. Consequently, the semiconductor INV layout structure 10 provided by the preferred embodiment includes a first transistor 120$p$ and a second transistor 120$n$. The first transistor 120$p$ includes the first source region 102$p$, the gate structure 110 and the first drain region 104$p$ while the second transistor 120$n$ includes the second source region 102$n$, the gate structure 110 and the second drain region 104n. Furthermore, the semiconductor INV layout structure 10 provided by the preferred embodiment further includes a plurality of dummy gates 112 formed at the two opposite sides of the gate structure 110. And the dummy gates 112 are parallel with the gate structure 110. It is noteworthy that the amount and arrangement of the dummy gates 112 are adjustable depending on the process or product requirements, and thus are not limited to this.

Please still refer to FIG. 1 and FIG. 2. The semiconductor INV layout structure 10 provided by the preferred embodiment further includes a plurality of conductive structures 130. The conductive structures 130 can be metal structures formed in an inter-layer dielectric (hereinafter abbreviated as ILD) layer. It is well-known to those skilled in the art that the abovementioned elements such as the active regions 100p/100n, the gate structure 110, the dummy gates 112, the ILD layer, and the conductive structures 130 can be fabricated in and/or on the semiconductor substrate by front-end-of-line (hereinafter abbreviated as FEOL) process. It is noteworthy that the conductive structures 130 include a plurality of slot-type conductive structures 130s and one island-type conductive structure 130i. As shown in FIG. 1 and FIG. 2, the slot-type conductive structures 130s are formed on the first active region 100p and the second active region 100n. In detail, the slot-type conductive structures 130s are respectively formed on the first source region 102p and the first drain region 104p of the first transistor 120p, and on the second source region 102n and the second drain region 104n of the second transistor 120n. In the preferred embodiment, the slot-type conductive structures 130s all extend along the first direction D1. Furthermore, though lengths L of the slot-type conductive structures 130s may be different, the lengths L of the slot-type conductive structures 130s are all larger than a width W of the active regions 100p/100n, but not limited to this. More important, the preferred embodiment provides one island-type conductive structure 130i formed on the gate structure 110. Since the conductive structures 130 (including the slot-type conductive structures 130s and the island-type conductive structure 130i) are all formed in the ILD layer, and are made for constructing electrical connections between the active regions 100p/100n and other devices and between the gate structure 110 and other devices, the conductive structures 130 are referred to as the zero wiring layer M0 in an interconnection structure. It should be noted that for clarifying the spatial relationship between the slot-type conductive structures 130s and the active regions 100p/100n, and the spatial relationship between the island-type conductive structure 130i and the gate structure 110, only the conductive structures 130, the active regions 100p/100n and the gate structure 110 are depicted in FIG. 1. However those skilled in the art would easily realize other elements of the semiconductor INV layout structure 10 provided by the preferred embodiment according to FIG. 2.

Please refer to FIG. 2. The semiconductor INV layout structure 10 provided by the preferred embodiment further includes a plurality of via structures 140 and a plurality of wire structures 150/152. The via structures 140 and the wire structures 150/152 can be metal structures formed in the same dielectric layer or in different dielectric layers. And the via structures 140 and the wire structures 150/152 are a portion in the interconnection structure. Those skilled in the art would easily realize that interconnection structure (including the via structures 140 and the wire structures 150/152) can be formed on the semiconductor substrate, the ILD layer and the abovementioned conductive structures 130 by back-end-of-line (hereinafter abbreviated as BEOL) process, however those details are omitted herein. As shown in FIG. 2, the via structures 140 are respectively formed on the slot-type conductive structures 130s and the island-type conductive structure 130i. At least one of the wire structures 150 overlaps the slot-type conductive structure 130s on the first drain region 104p of the first transistor 120p and overlaps the via structure 140 on that the slot-type conductive structure 130s. The mentioned wire structure 150 further overlaps the slot-type conductive structure 130s on the second drain region 104n of the second transistor 120n and overlaps the via structure 140 on that slot-type conductive structure 130s, concurrently. Consequently, the via structures 140 electrically connect the conductive structures 130 and the wire structure 150. As shown in FIG. 2, a width of the island-type conductive structure 130i is larger than a width of the via structures 140. Furthermore, the wire structures 150 are referred to as the first wiring layer M1 of the abovementioned interconnection structure. And the via structures 140 electrically connecting the conductive structures 130 to the wire structures 150 are referred to as the zero plug V0 of the abovementioned interconnection structure. It is well-known to those skilled in the art that the semiconductor INV layout structure 10 provided by the preferred embodiment can further include other elements formed on the first wiring layer M1 such as a second wiring layer M2 and a first plug V1 electrically connecting the first wiring layer M1 to the second wiring layer M2 if required. Furthermore, the wire structures 152 are a pair of wire structures respectively formed on a top side and a bottom side of the semiconductor INV layout structure 10. One of the wire structures 152 is electrically connected to a system power Vcc and the other one is electrically connected to a ground potential.

Please refer to FIG. 2 and FIG. 3. By positioning the conductive structures 130, the via structures 140 and the wire structures 150/152, electrical connections are constructed and an INV circuit 12 is obtained. As shown in FIG. 2 and FIG. 3, the INV circuit 12 includes a p-transistor M0 (that is the first transistor 120p) and an n-transistor M1 (that is the second transistor 120n) electrically connected in series. The p-transistor M0 (the first transistor 120p) is electrically connected to the wire structure 152 and the system power Vcc by the first source region 102p, the slot-type conductive structure 130s and the via structure 140. The n-transistor M1 (the second transistor 120n) is electrically connected to the wire structure 152 and the ground potential by the second source region 102n, the slot-type conductive structure 130s and the via structure 140. More important, an input signal A is simultaneously transmitted into the gate structure 110 of the p-transistor M0 (the first transistor 120p) and the n-transistor M1 (the second transistor 120n) through the wire structure 150, the via structures 140, and the island-type conductive structure 130i. Moreover, through the first drain region 104p and the second drain region 104n, the two slot-type conductive structures 130s respectively formed on the first drain region 104p and the second drain region 104n, the two via structures 140 formed on the abovementioned two conductive structures 130s, and the wire structure 150 formed on the abovementioned two via structures 140, an output signal Z is received.

It is understood that conventional planar metal-oxide-semiconductor (hereinafter abbreviated as MOS) transistor has difficulty when scaling down to 65 nm and below. Therefore the non-planar transistor technology such as Fin Field effect transistor (hereinafter abbreviated as FinFET)

technology that allows smaller size and higher performance is developed to replace the planar MOS transistor. Accordingly, though the semiconductor INV layout structure 10 is exemplarily detailed as a planar layout structure, the active regions 100p/100n can be replaced with fin structures by performing any planar-to-fin conversion method in the state-of-the-art. Therefore, the first active region 100p and the second active region 100n of the semiconductor INV layout structure 10 provided by the preferred embodiment can respectively include fin structure(s). It should be noted that that in the case the active regions 100p/100n respectively include the fin structure(s), the fin structure(s) is extended along a second direction D2, which is perpendicular to the first direction D1, and arranged along the first direction D1.

According to the semiconductor INV layout structure 10 provided by the preferred embodiment, the slot-type conductive structures 130s and the island-type conductive structure 130i are formed in one same layer. The slot-type conductive structures 130s electrically connect the source/drain 102p/104p and 102n/104n to other devices while the island-type conductive structure 130i electrically connects the gate structure 110 to other devices. Briefly, speaking, by providing the slot-type conductive structures 130s and the island-type conductive structure 130i in the one single layer, the present invention provides a semiconductor INV layout structure 10 including a simplified layout design without affecting the required electrical connections, and thus fabrication for the semiconductor INV layout structure 10 is improved.

Figure 4:
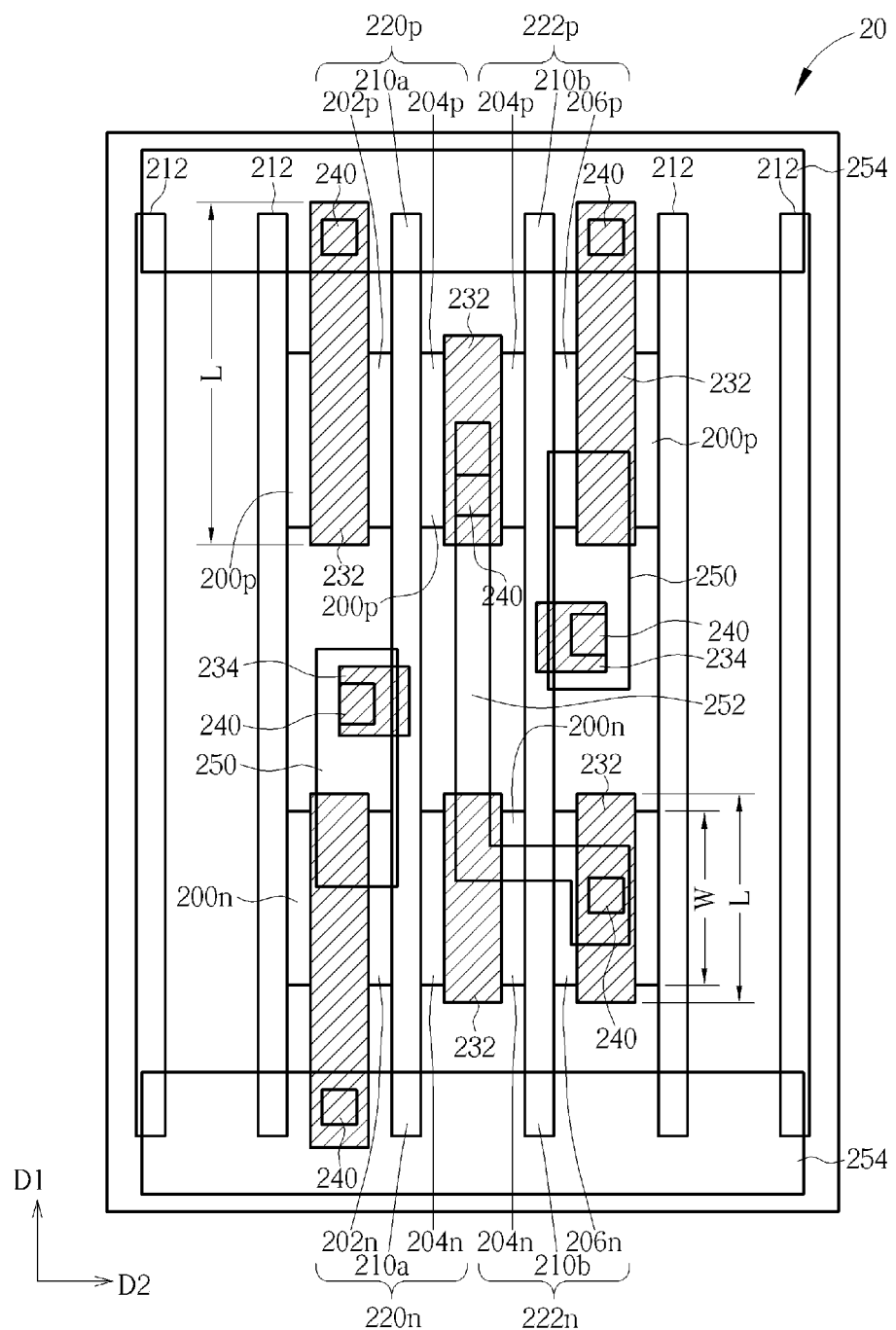
FIG. 4 is a schematic drawing of a semiconductor ND2 layout structure provided by a preferred embodiment of the present invention.
Figure 5:
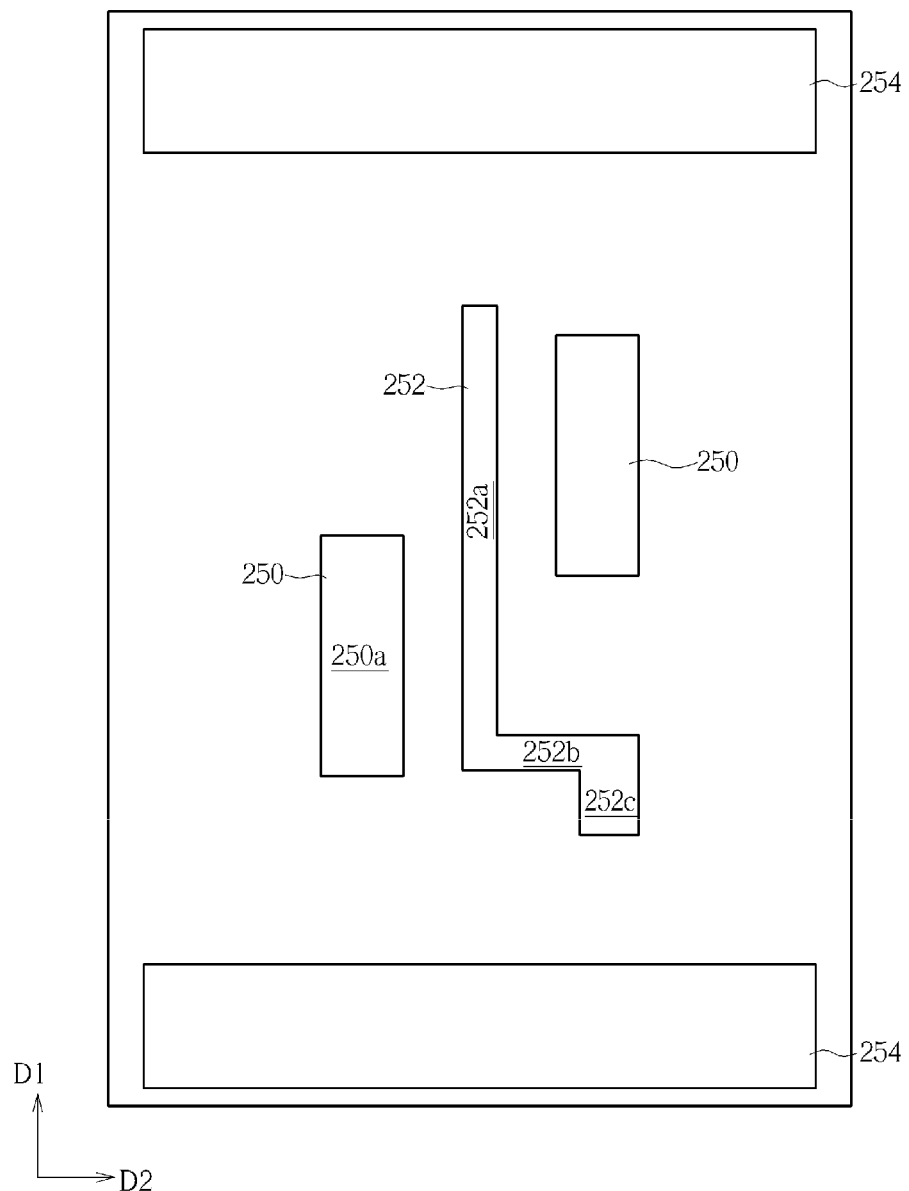
FIG. 5 is a schematic drawing of a portion of the semiconductor ND2 layout structure provided by the preferred embodiment of the present invention.
Figure 6:
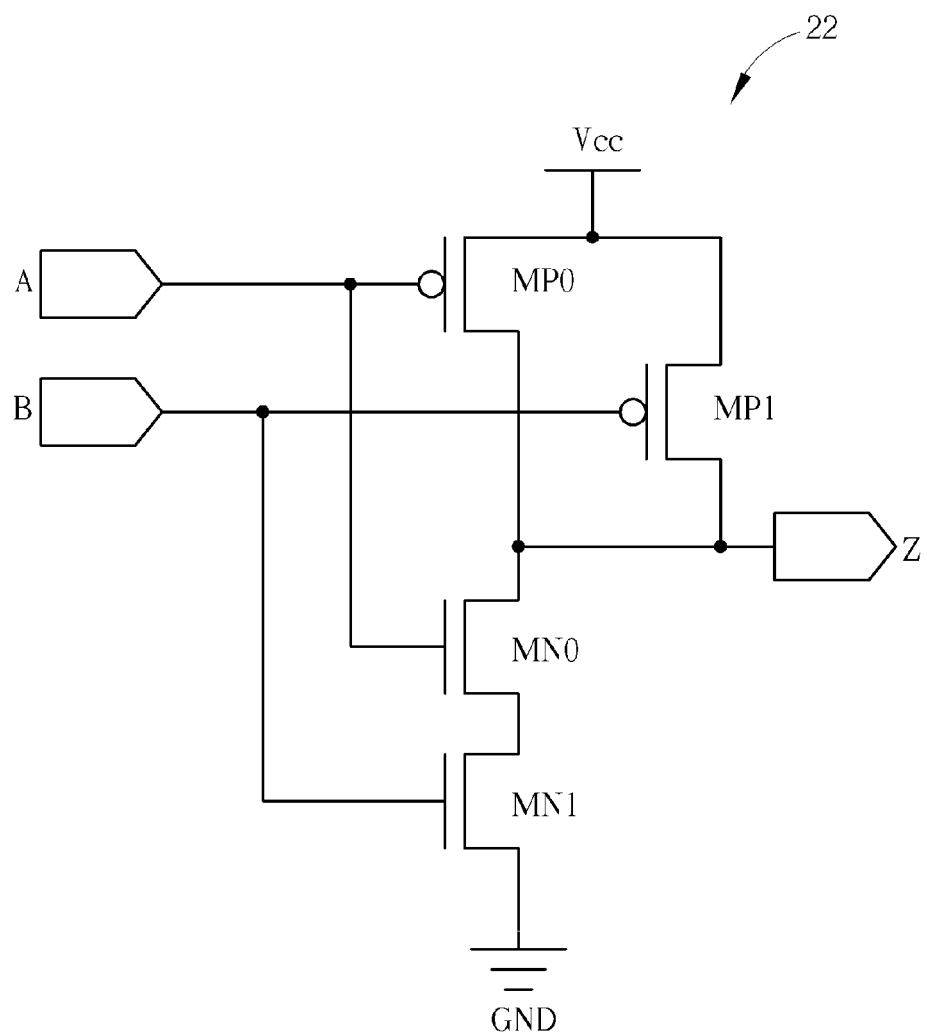
FIG. 6 is a circuit diagram of a ND2 circuit provided by the present invention.

Please refer to FIGS. 4-6, FIG. 4 is a schematic drawing of a semiconductor ND2 layout structure provided by a preferred embodiment of the present invention, FIG. 5 is a schematic drawing of a portion of the semiconductor ND2 layout structure provided by the preferred embodiment of the present invention, and FIG. 6 is a circuit diagram of a ND2 circuit provided by the present invention. In order to clearly describe the layout structure of the preferred embodiment FIG. 4 and FIG. 5 should be referred together. As shown in FIG. 4, a semiconductor ND2 layout structure 20 provided by the preferred embodiment includes a first active region 200p and a second active region 200n. The first active region 200p and the second active region 200n are complementary to each other. For example but not limited to, the first active region 200p is a p-typed region and the second active region 200n is an n-typed region in the preferred embodiment. Additionally, an n-well can be formed in the p-typed first active region 200p while a p-well can be formed in the n-typed second active region 200n if required. Furthermore, the first active region 200p, the second active region 200n, the n-well, and the p-well can be formed in a semiconductor substrate (not shown), however those details are omitted herein. As shown in FIG. 1 and FIG. 2, the first active region 200p is physically spaced apart and isolated from the second active region 200n. The semiconductor INV layout structure 20 includes a first gate structure 210a and a second gate structure 210b formed on the semiconductor substrate. The first gate structure 210a and the second gate structure 210b respectively include a gate dielectric layer (not shown) and a gate conductive layer (not shown). As shown in FIG. 4, the first gate structure 210a and the second gate structure 210b respectively extend along a first direction D1 and straddle the first active region 200p and the second active region 200n. Therefore, the first active region 200p at two opposite sides of the first gate structure 210a respectively forms a first source region 202p and a first drain region 204p, and the second active region 200n at the two opposite sides of the first gate structure 210a respectively forms a second source region 202n and a second drain region 204n. In the same concept, the first active region 200p at two opposite sides of the second gate structure 210b respectively forms a third source region 204p and a third drain region 206p, and the second active region 200n at the two opposite sides of the second gate structure 210b respectively forms a fourth source region 204n and a fourth drain region 206n. Consequently, the semiconductor ND2 layout structure 20 includes a first transistor 220p, a second transistor 220n, a third transistor 222p, and a fourth transistor 222n. The first transistor 220p includes the first source region 202p, the first gate structure 210a and the first drain region 204p. The second transistor 220n includes the second source region 202n, the first gate structure 210a and the second drain region 204n. The third transistor 222p includes the third source region 204p, the second gate structure 210b and the third drain region 206p. And the fourth transistor 222n includes the fourth source region 204n, the second gate structure 210b and the fourth drain region 206n. It is noteworthy that a portion of the first active region 200p and a portion of the second active region 200n are formed in between the first gate structure 210a and the second gate structure 210b, as shown in FIG. 4. In other words, the first active region 200p in between the first gate structure 210a and the second gate structure 210b serves as the first drain region 204p and the third source region 204p at the same time. In the same concept, a portion of the second active region 200p in between the first gate structure 210a and the second gate structure 210b serves as the second drain region 204n and the fourth source region 204n at the same time. Therefore, the first transistor 220p and the third transistor 222p are electrically connected in series by the first drain region 204p and the third source region 204p, and the second transistor 220n and the fourth transistor 222n are electrically connected in series by the second drain region 204n and the fourth source region 204n. The semiconductor ND2 layout structure 20 provided by the preferred embodiment further includes a plurality of dummy gates 212, and the first gate structure 210a and the second gate structure 210b are formed in between the dummy gates 212. As shown in FIG. 4, the dummy gates 212 are parallel with the first gate structure 210a and the second gate structure 210b. It is noteworthy that, the amount and arrangement of the dummy gates 212 are adjustable depending on the process or product requirements, and thus are not limited to this.

Please still refer to FIG. 4. The semiconductor ND2 layout structure 20 provided by the preferred embodiment further includes a plurality of first conductive structures 232 and two second conductive structures 234. The first conductive structures 232 and the second conductive structures 234 can be metal structures formed in an ILD layer. It is well-known to those skilled in the art that the abovementioned elements such as the active regions 200p/200n, the gate structures 210a/210b, the dummy gates 212, the ILD layer and the conductive structures 232/234 can be fabricated in and/or on the semiconductor substrate by FEOL process. It is noteworthy that in the preferred embodiment, the first conductive structures 232 are slot-type first conductive structures while the second conductive structures 234 are island-type second conductive structures. As shown in FIG. 4, the slot-type first conductive structures 232 are formed on the first active region 200p and the second active region 200n at the two sides of the first gate structure 210a, and on the first active region 200p and the second active region 200n at the two sides of the second gate structure 210b. In detail, on any of the source region 202p/204p/202n/204n and on any of the drain region 204p/206p/204n/206n, there is formed a first conductive structure 232. The first conductive structures 232 are all extended along the first direction D1. Additionally, though lengths L of the first conductive structures 232 may be different, the lengths L of the first conductive structures 232 are all larger than a width W of the active regions 200p/200n, but not limited to this. The island-type second conductive structures 234 are respectively formed on the first gate structure 210a and the second gate structure 210b. As mentioned above, since the first conductive structures 232 and the second conductive structures 234 are all formed in the ILD layer, and are made for constructing electrical connections between the active region 200p/200n and other devices and between the gate structures 210a/210b and other devices, the first conductive structures 232 and the second conductive structures 234 are referred to as the zero wiring layer M0 in an interconnection structure.

Please still refer to FIG. 4. The semiconductor ND2 layout structure 20 provided by the preferred embodiment further includes a plurality of via structures 240, a plurality of first wire structures 250, at least one second wire structure 252, and a plurality of third wire structures 254. The via structures 240 and the wire structures 250/252/254 can be metal structures formed in the same dielectric layer or in different dielectric layers. And the via structures 240 and the wire structures 250/252/254 are a portion in the interconnection structure. As mentioned above, the interconnection structure (including the via structures 240 and the wire structures 250/252/254) can be formed on the semiconductor substrate, the ILD layer and the abovementioned conductive structures 232/234 by BEOL process. As shown in FIG. 4, the via structures 240 are respectively formed on the first conductive structures 232 and the second conductive structures 234.

Please refer to FIG. 4 and FIG. 5. It should be noted that for clarifying the first wire structures 250, the second wire structure 252 and the third wire structures 254, only those wire structures 250/252/254 are depicted in FIG. 5. However those skilled in the art would easily realize other elements of the semiconductor ND2 layout structure 20 provided by the preferred embodiment according to FIG. 4. As shown in FIG. 4 and FIG. 5, according to the preferred embodiment, the first wire structures 250 respectively include a first portion 250a, and the first portion is extended along the first direction D1. The second wire structure 252 includes a first portion 252a and a second portion 252b. The first portion 252a is extended along the first direction D1 and the second portion 252b is extended along a second direction D2. As shown in FIG. 4 and FIG. 5, the second direction D2 is perpendicular to the first direction D1. Furthermore, the second wire structure 252 can further include a third portion 252c in the preferred embodiment. The third portion can be extended along the first direction D1, and the second portion 252b connects the first portion 252a and the third portion 252c. The third wire structures 254 are a pair of wire structures extending along the second direction D2. As shown in FIG. 4 and FIG. 5, the third wire structures 254 are respectively formed at a top side and a bottom side of the semiconductor ND2 layout structure 20. One of the third wire structures 254 is electrically connected to a system power Vcc and the other one is electrically connected to a ground potential.

Please refer to FIG. 4 and FIG. 5. According to the preferred embodiment, the first portion 252a of the second wire structure 252 overlaps the first active region 200p and the second active region 200n in between the first gate structure 210a and the second gate structure 210b. In other words, the first portion 252a of the second wire structure 252 overlaps the first drain region 204p of the first transistor 220p (that is also the third source region 204p of the third transistor 222p) and the second drain region 204n of the second transistor 220n (that is also the fourth source region 204n of the fourth transistor 222n). It is noteworthy that the third portion 252c and the first portion 252a of the second wire structure 252 are respectively formed on the second active region 200n at the two opposite sides of the second gate structure 210b. That is, the third portion 252c is formed on the fourth drain region 206n of the fourth transistor 222n. Accordingly, the first drain region 204p of the first transistor 220p (the third source region 204p of the third transistor 222p) is electrically connected to the fourth drain region 206n of the fourth transistor 222n through the conductive structure 232, the via structure 240, the second wire structure 252, the via structure 240, and the conductive structure 232. It is also noteworthy that although there is one first conductive structure 232 formed on the second active region 200n in between the first gate structure 210a and the second gate structure 210b, that first conductive structure 232 is not electrically connected to any of the via structures or wire structures in the preferred embodiment. Therefore, that first conductive structure 232 formed on the second active region 200n between the first gate structure 210a and the second gate structure 210b is an electrical floating element. Furthermore, the wire structures 250/252/254 are referred to as the first wiring layer M1 of the abovementioned interconnection structure, and the via structures 240 electrically connecting the conductive structures 232/234 to the wire structures 250/252/254 are referred to as the zero plug V0 of the abovementioned interconnection structure. It is well-known to those skilled in the art that the semiconductor ND2 layout structure 20 provided by the preferred embodiment can further include other elements formed on the first wiring layer M1 such as the second wiring layer M2 and first plug V1 electrically connecting the first wiring layer M1 to the second wiring layer M2 if required, however those details are omitted herein.

Please refer to FIG. 4 and FIG. 6. By providing the abovementioned conductive structures 232/234, via structures 240 and wire structures 250/252/254, electrical connections are constructed and an ND2 circuit 22 is obtained. The ND2 circuit 22 includes a p-transistor MP0 (the third transistor 222p), an n-transistor MN0 (the fourth transistor 222n), a p-transistor MP1 (the first transistor 220p), and an n-transistor MN1 (the second transistor 220n). The p-transistor MP0 and the p-transistor MP1 are electrically connected to the wire structure 254 and the system power Vcc through the first conductive structures 232 and the via structures 240. An input signal A is simultaneously transmitted into the gate structure of the p-transistor MP0 and the n-transistor MN0 through the first wire structure 250, the via structure 240 and the second conductive structure 234, and an input signal B is simultaneously transmitted into the gate structure of the p-transistor MP1 and the n-transistor MN1 through the first wire structure 250, the via structure 240 and the second conductive structure 234. Moreover, through the first conductive structure 232 formed on the fourth drain region 206n, the via structure 240, and the second wire structure 252, an output signal Z is received.

As mentioned above, the conventional planar MOS transistor has difficulty when scaling down to 65 nm and below. Therefore the non-planar transistor technology such as FinFET technology that allows smaller size and higher performance is developed to replace the planar MOS transistor. Accordingly, though the semiconductor ND2 layout structure 20 is exemplarily detailed as a planar layout structure, the active regions 200p/200n can be replaced with fin structures by performing any planar-to-fin conversion method in the state-of-the-art. Therefore, the first active region 200p and the second active region 200n of the semiconductor ND2 layout structure 20 provided by the preferred embodiment can respectively include fin structure(s). It should be noted that that in the case the active regions 200p/200n respectively includes the fin structure(s), the fin structure(s) is extended along a second direction D2, which is perpendicular to the first direction D1, and arranged along the first direction D1.

According to the semiconductor ND2 layout structure 20 provided by the preferred embodiment, the slot-type first conductive structures 232 and the island-type second conductive structure 234 are formed in one same layer. More important, the semiconductor ND2 layout structure 20 provide by the preferred embodiment further provides the first wire structures 250 and the third wire structures 254 including one extending direction and the second wire structure 252 including at least two extending directions formed in one same layer. Consequently, electrical connections are constructed. By providing the slot-type (232)/island-type (234) conductive structures and the one-direction (250/254)/multi-direction (252) wire structures, the present invention provides a semiconductor ND2 layout structure 20 including a simplified layout design without affecting the required electrical connections, and thus fabrication for the semiconductor ND2 layout structure 20 is improved.

Figure 7:
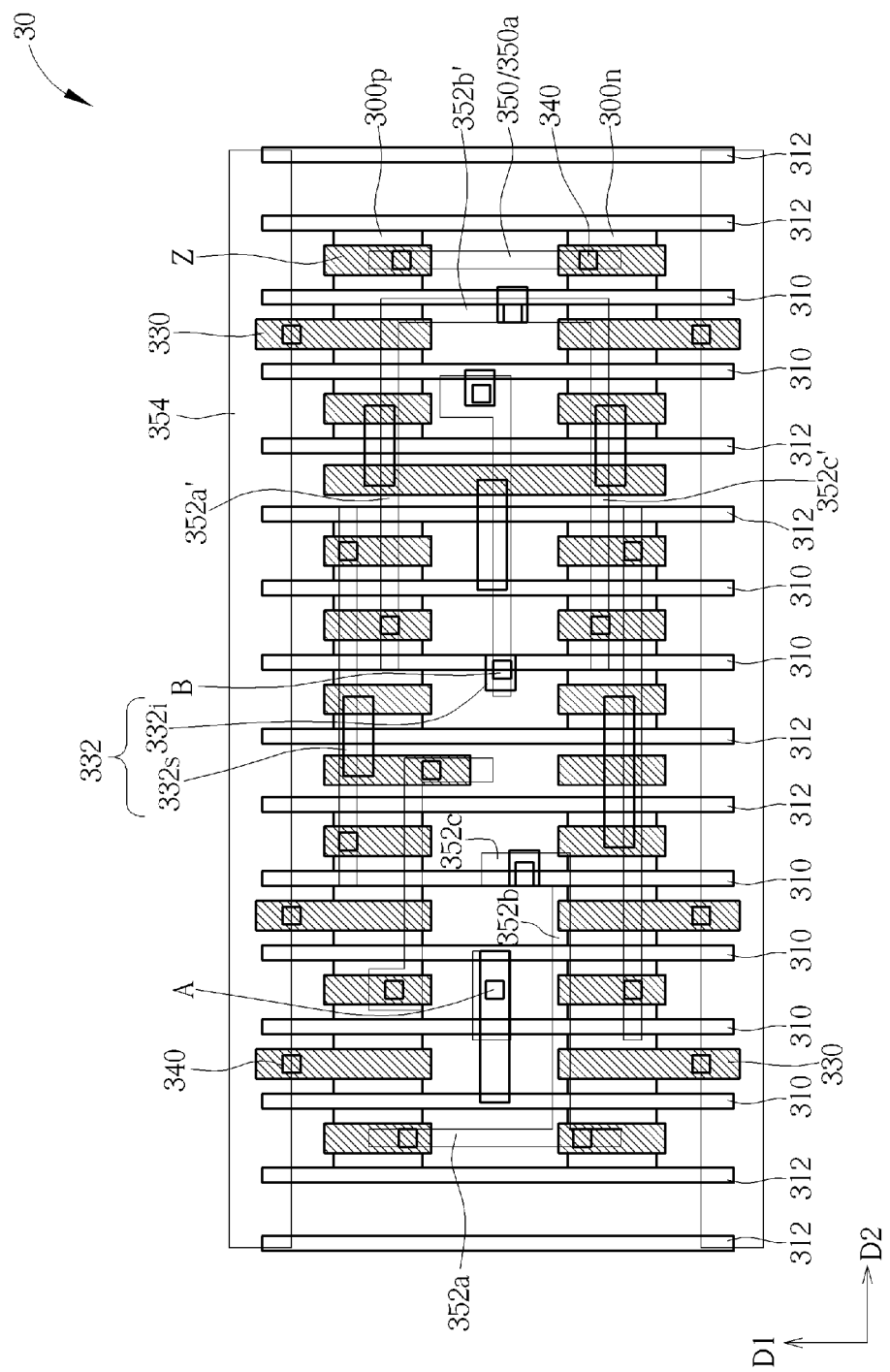
FIG. 7 is a schematic drawing of a semiconductor XOR2 layout structure provided by a preferred embodiment of the present invention.
Figure 8:
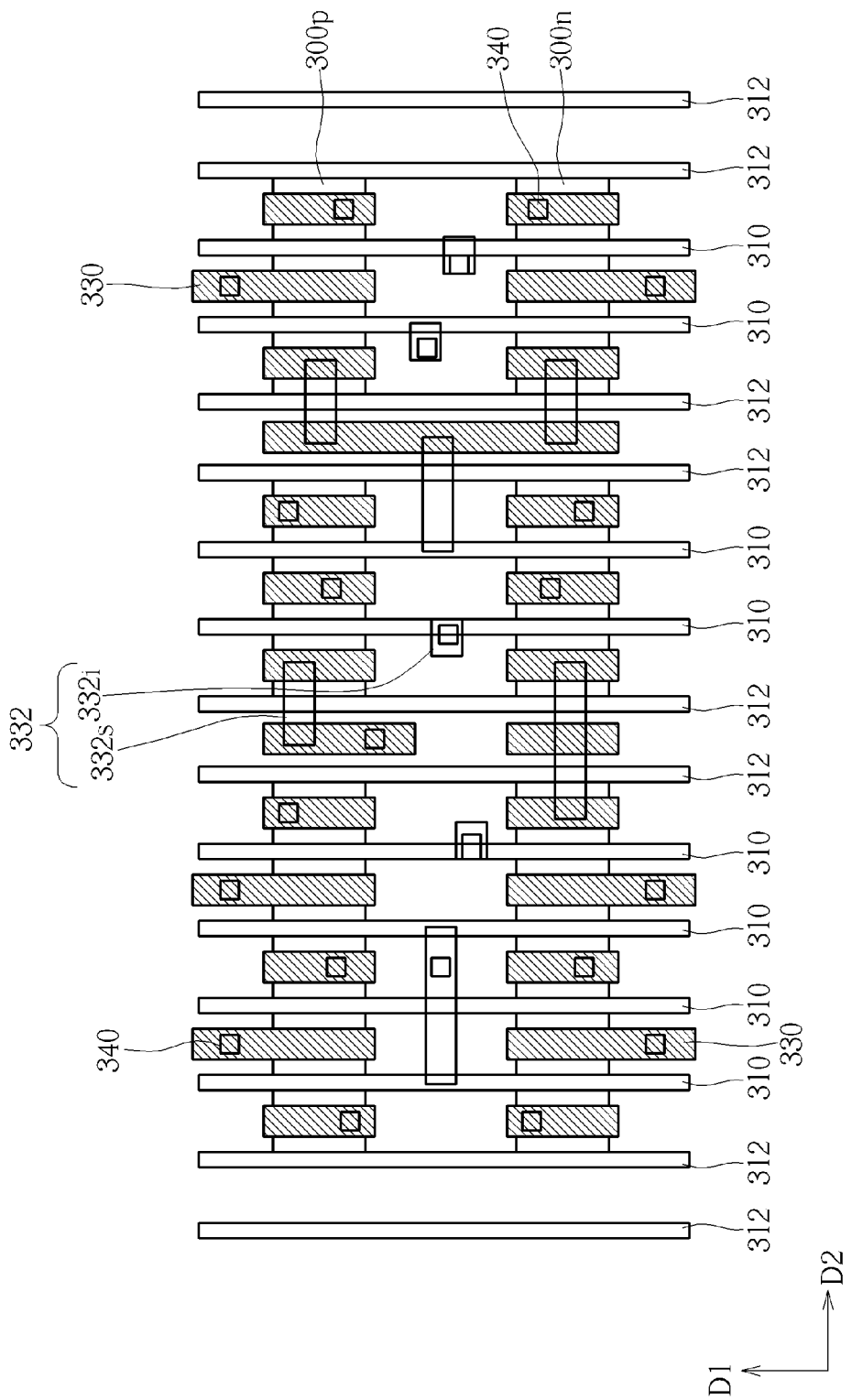
FIGS. 8 and 9 are schematic drawings of different portions of the semiconductor XOR2 layout structure provided by the preferred embodiment of the present invention.
Figure 9:
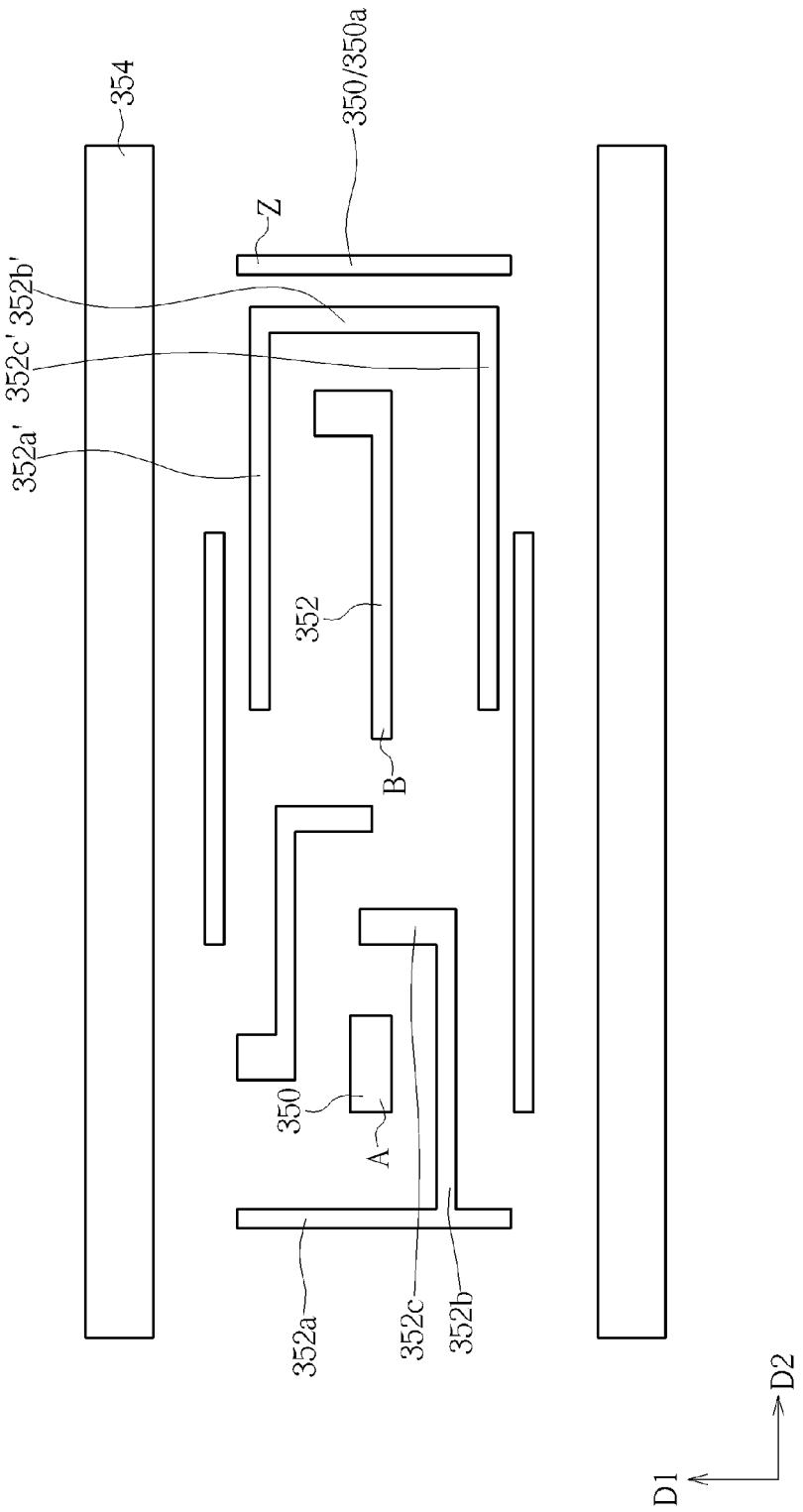
Figure 10:
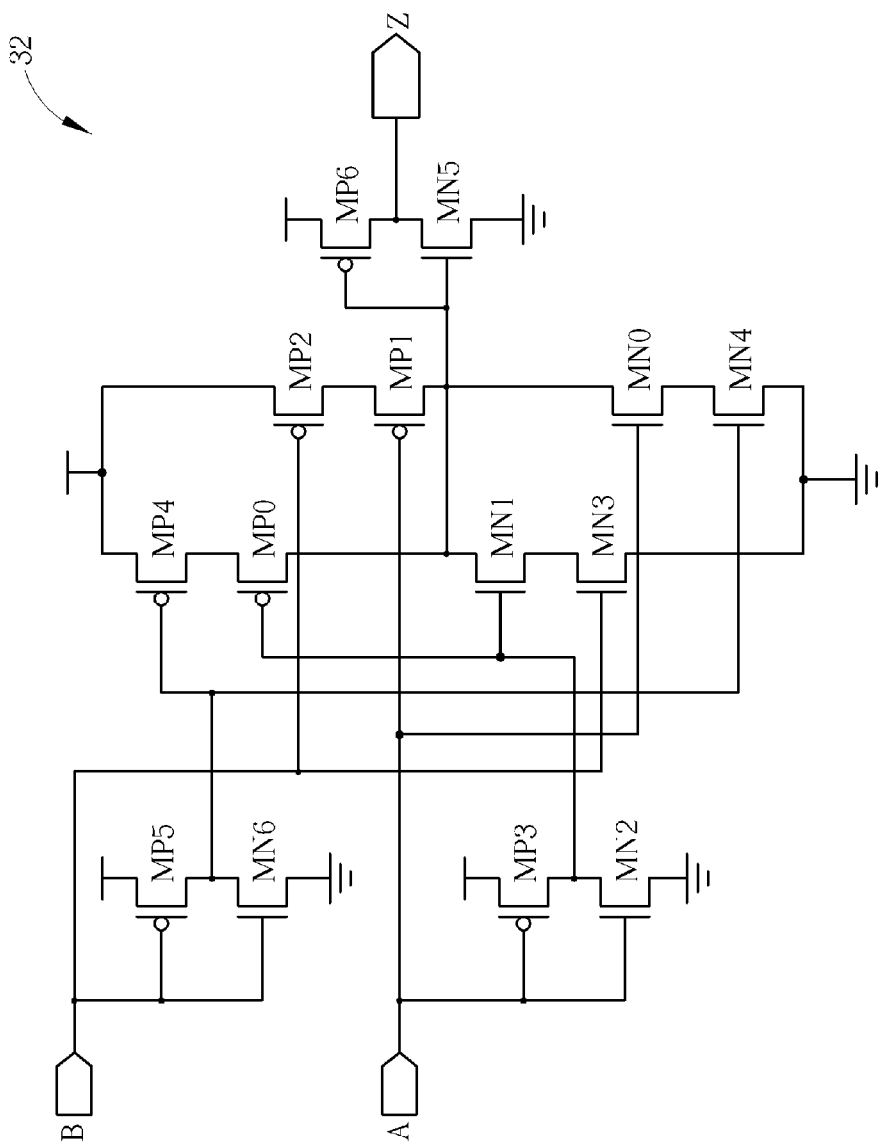
FIG. 10 is a circuit diagram of a XOR2 circuit provided by the present invention.

Please refer to FIGS. 7-10, FIG. 7 is a schematic drawing of a semiconductor XOR2 layout structure provided by a preferred embodiment of the present invention, FIGS. 8 and 9 are schematic drawings of different portions of the semiconductor XOR2 layout structure provided by the preferred embodiment of the present invention, and FIG. 10 is a circuit diagram of a XOR2 circuit provided by the present invention. As shown in FIG. 7, the semiconductor XOR2 layout structure 30 provided by the preferred embodiment includes a plurality of first active regions 300p and a plurality of second active regions 300n. Both of the first active regions 300p and the second active regions 300n are arranged along a second direction D2. The first active regions 300p and the second active regions 300n are complementary to each other. For example but not limited to, the first active regions 300p are p-typed regions and the second active regions 300n are n-typed regions. As mentioned above, an n-well can be formed in the p-typed first active regions 300p while a p-well can be formed in the n-typed second active regions 300n if required. Also, the first active regions 300p, the second active regions 300n, the n-well(s), and the p-well(s) can be formed in a semiconductor substrate (not shown), however those details are omitted herein. As shown in FIG. 7, the first active regions 300p are physically spaced apart and isolated from the second active regions 300n. The semiconductor XOR2 layout structure 30 further includes a plurality of gate structures 310 formed on the semiconductor substrate. The gate structures 310 respectively include a gate dielectric layer (not shown) and a gate conductive layer (not shown). As shown in FIG. 7, the gate structures 310 are extended along a first direction D1 and straddle the first active regions 300p and the second active regions 300n, respectively. As shown in FIG. 7, the first direction D1 is perpendicular to the second direction D2. The first active regions 300p at two opposite sides of the gate structures 310 respectively form a source/drain region. In the same concept, the second active regions 300n at two opposite sides of the gate structures 310 respectively form a source/drain region. It is well-known to those skilled in the art that the gate structure 310 and the source region and the source/drain region formed at its two sides construct a transistor. Accordingly, the first active regions 300p and the second active regions 300n formed in between adjacent two gate structures 310 serve as shared source/drain, and thus the two transistors are electrically connected in series. Additionally, the semiconductor XOR2 layout structure 30 provided by the preferred embodiment further includes a plurality of dummy gates 312 extending along the first direction D1. Therefore the dummy gates 312 are parallel with the gate structures 310. As shown in FIG. 7, at least one side of the dummy gates 312 lacks any active region 300p/300n. It is noteworthy that, the amount and arrangement of the dummy gates 332 are adjustable depending on the process or product requirements, and thus are not limited to this.

Please refer to FIG. 7 and FIG. 8. The semiconductor XOR2 layout structure 30 provided by the preferred embodiment further includes a plurality of first conductive structures 330 and a plurality of second conductive structures 332. The first conductive structures 330 and the second conductive structures 332 can be metal structures formed in an ILD layer. Additionally, it is well-known to those skilled in the art that the abovementioned elements such as the active regions 300p/300n, the gate structures 310, the dummy gates 312, the ILD layer, and the conductive structures 330/332 can be fabricated in and/or on the semiconductor substrate by FEOL process. In the preferred embodiment, the first conductive structures 330 are slot-type first conductive structures, and those slot-type first conductive structures 330 are extended along the first direction D1 and arranged along the second direction D2. More important, the first conductive structures 330 are formed on the first active regions 300p and the second active regions 300n. In detail, in any of the source regions and drain regions, there is positioned a first conductive structure 330. Additionally, the first conductive structures 330 can be formed on the semiconductor substrate/layer in between the first active region 300p and/or in between the second active region 300n. Furthermore, though lengths L of the first conductive structures 330 may be different, the lengths L of the first conductive structures 330 are all larger than a width W of the active regions 300p/300n, but not limited to this. In the preferred embodiment, the second conductive structures 332 are formed on the gate structures 310. In detail, the second conductive structures 332 further includes a plurality of slot-type second conductive structures 332s and a plurality of island-type second conductive structures 332i. As shown in FIG. 7 and FIG. 8, the island-type second conductive structures 332i are formed on the gate structures 310 and the slot-type second conductive structures 332s are extended along the second direction D2. As shown in FIG. 7 and FIG. 8, the slot-type second conductive structures 332s straddle one to three gate structures 310. As mentioned above, since the first conductive structures 330 and the second conductive structures 332 (including the slot-type second conductive structures 332s and the island-type second conductive structures 332i) are formed in the ILD layer, and are made for constructing electrical connections between the active regions 300p/300n and other devices and between the gate structures 310 and other devices, the first conductive structures 330 and the second conductive structures 332 are referred to as the zero wiring layer M0 in an interconnection structure. It should be noted that for clarifying the spatial relationship between the first conductive structures 330 and the active regions 300p/330n, and the spatial relationship between the second conductive structures 332 and the gate structures 310, only the conductive structures 330/332, the active regions 300p/300n and the gate structures 310 are depicted in FIG. 8. However those skilled in the art would easily realize other elements of the semiconductor XOR2 layout structure 30 provided by the preferred embodiment according to FIG. 7.

Please refer to FIG. 7 again. The semiconductor XOR2 layout structure 30 provided by the preferred embodiment further includes a plurality of via structures 340, a plurality of first wire structures 350, at least one second wire structure 352, and a plurality of third wire structures 354. The via structures 340 and the wire structures 350/352/354 can be metal structures formed in the same dielectric layer or in different dielectric layers. And the via structures 340 and the wire structures 350/352/354 are a portion in the interconnection structure. As mentioned above, the interconnection structure (including the via structures 340 and the wire structures 350/352/354) can be formed on the semiconductor substrate, the ILD layer and the abovementioned conductive structures 332/334 by BEOL process. As shown in FIG. 7, the via structures 340 are formed on the first conductive structures 330 and the second conductive structures 332. However, not every conductive structures 330/332 includes a via structure 340 formed thereon. In the semiconductor XOR2 layout structure 30 provided by the preferred embodiment, the conductive structure(s) 330/332 can be electrically connected to the via structures 340 or to nothing. That is, the conductive structure (s) 330/332 can be electrically floating element(s) if required.

Please refer to FIG. 7 and FIG. 9. It should be noted that for clarifying the first wire structures 350, the second wire structure 352 and the third wire structures 354, only those wire structures 350/352/354 are depicted in FIG. 9. However those skilled in the art would easily realize other elements of the semiconductor XOR2 layout structure 30 provided by the preferred embodiment according to FIG. 7. As shown in FIG. 7 and FIG. 9, in the preferred embodiment, the first wire structures 350 respectively include a first portion 350*a* and the first portion 350*a* are extended along the first direction D1 or the second direction D2. The second wire structure 352 includes a first portion 352*a* and a second portion 352*b*. The first portion 352*a* is extended along the first direction D1 and the second portion 352*b* is extended along the second direction D2. In the preferred embodiment, the second wire structure 352 can further include a third portion 352*c*, and the third portion is extended along the first direction D1. And the second portion 352*b* connects the first portion 352*a* and the third portion 352*c*. It is noteworthy that in a modification to the preferred embodiment, the second wire structure 352 can further includes a fourth portion 352*a*' a fifth portion 352*b*' and a sixth portion 352*c*'. The fourth portion 352*a*' and the sixth portion 352*c*' are extended along the second direction D2, and the fifth portion 352*b*' is extended along the first direction D1. And the fifth portion 352*b*' connects the fourth portion 352*a*' and the sixth portion 352*c*'. The third wire structures 354 are extended along the second direction D2. According to the preferred embodiment, at least two third wire structures are respectively formed at a top side and a bottom side of the semiconductor XOR2 layout structure 30. One of the third wire structures 354 is electrically connected to a system power Vcc and the other one is electrically connected to a ground potential. Please refer to FIG. 7 and FIG. 9. In the preferred embodiment, the first wire structures 350, the second wire structure 352, and the third wire structures 354 are formed on the via structures 340 if required and thus electrical connections are constructed. As mentioned above, the wire structures 350/352/354 are referred to as the first wiring layer M1 of the abovementioned interconnection structure, and the via structures 340 electrically connecting the conductive structures 330/332 to the wire structures 350/352/354 are referred to as the zero plug V0 of the abovementioned interconnection structure. It is well-known to those skilled in the art that the semiconductor XOR2 layout structure 30 provided by the preferred embodiment can further include other elements formed on the first wiring layer M1 such as the second wiring layer M2 and the first plug V1 electrically connecting the first wiring layer M1 to the second wiring layer M2 if required, however those details are omitted herein.

Please refer to FIG. 7 and FIG. 10. By providing the abovementioned conductive structures 330/332, the via structures 340 and wire structures 350/352/354, electrical connections are constructed and a XOR2 circuit 32 is obtained. As shown in FIG. 7 and FIG. 10, the XOR2 circuit 32 includes a plurality of p-transistors MP0-MP6 and a plurality of n-transistors MN0-MN6. An input signal A is transmitted into the XOR2 circuit 32 through the first wire structure 350, the via structure 340 and the slot-type second conductive structure 332. An input signal B is transmitted into the XOR2 circuit 32 through the second wire structure 352, the via structure 340 and the island-type second conductive structure 332*i*. Furthermore, through the first conductive structures 330, the via structures 340 and the first wire structure 350, an output signal Z is received.

As mentioned above, the conventional planar MOS transistor has difficulty when scaling down to 65 nm and below. Therefore the non-planar transistor technology such as FinFET technology that allows smaller size and higher performance is developed to replace the planar MOS transistor. Accordingly, though the semiconductor XOR2 layout structure 30 is exemplarily detailed as a planar layout structure, the active regions 300*p*/300*n* can be replaced with fin structures by performing any planar-to-fin conversion method in the state-of-the-art. Therefore, the first active regions 300*p* and the second active regions 300*n* of the semiconductor XOR2 layout structure 30 provided by the preferred embodiment can respectively include fin structures. It should be noted that that in the case the active regions 300*p*/300*n* respectively includes the fin structures, the fin structures are extended along the second direction D2 and arranged along the first direction D1.

According to the semiconductor XOR2 layout structure 30 provided by the preferred embodiment, the first conductive structures 330 and the second conductive structures 332*s* that perpendicular to each other, and the island-type second conductive structures 332*i* are formed in one same layer. Furthermore, the semiconductor XOR2 layout structure 30 of the preferred embodiment provides the first wire structures 350 and the third wire structures 354 including one extending direction and the second wire structure 352 including at least two extending directions. Consequently, electrical connections are constructed in one single layer formed one same layer. By providing the slot-type (330/332*s*)/island-type (332*i*) conductive structures and the one-direction (350/354)/multi-directions (352) wire structures, the present invention provides a semiconductor XOR2 layout structure 30 including a simplified layout design without affecting the required electrical connections, and thus fabrication for the semiconductor XOR2 layout structure 30 is improved.

Accordingly, the present invention provides a semiconductor INV layout structure, a semiconductor ND2 layout structure and a semiconductor XOR2 layout structure. In the abovementioned semiconductor layout structures, the slot-type conductive structures and the island-type conductive structure(s) are formed in one same layer. By providing the slot-type conductive structures and the island-type conductive structure in the one single layer, the present invention provides semiconductor layout structures including simplified layout design without affecting the required electrical connections. In the more complicated semiconductor ND2 layout structure and the semiconductor XOR2 layout structure, the first wire structures (and the third wire structures) extending along one direction and the second wire structure(s) extending along at least two directions are formed in one same layer. By providing the first wire structures and the second wire structure in the one single layer, the present invention provides a semiconductor ND2 layout structure and a semiconductor XOR2 layout structure including a further simplified layout design without affecting the required electrical connections. In the even more complicated semiconductor XOR2 layout structure, the first conductive structures and the second conductive structures are formed in one same layer. An extending direction of the first conductive structures is parallel with an extending direction of the gate structures. The second conductive structures further include the island-type conductive structures and the slot-type conductive structures perpendicular to the gate structures. Accordingly, the present invention provides a semiconductor XOR2 layout structure including an even further simplified layout design without affecting the required electrical connections. Briefly speaking, by providing the island/slot-type conductive structures, the conductive structures including different extending directions and the wire structures including one or multiple extending directions, the present invention provides kinds of semiconductor layout structures including a simplified layout design without affecting the required electrical connections. Therefore the present invention improves the fabrication of those devices, the whole layout design and the process yield, and also the present invention reduces the process complexity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor layout structure comprising:
   a plurality of first active regions arranged along a second direction;
   a plurality of second active regions arranged along the second direction, and the second active regions being isolated from the first active regions;
   a plurality of gate structures extending along a first direction, the first direction being perpendicular to the second direction, and the gate structures respectively straddling the first active regions and the second active regions;
   a plurality of first conductive structures extending along the first direction, and the first conductive structures being formed on the first active regions and the second active regions; and
   a plurality of second conductive structures formed on and directly contacting the gate structures, the second conductive structures further comprising a plurality of slot-type second conductive structures and a plurality of island-type second conductive structures, the island-type second conductive structures being formed on the gate structures, and the slot-type second conductive structures being extended along the second direction.

2. The semiconductor IC layout structure according to claim 1, wherein the first active regions and the second active regions respectively comprise at least a fin structure.

3. The semiconductor IC layout structure according to claim 1, wherein the first active regions are complementary to the second active regions.

4. The semiconductor IC layout structure according to claim 1, further comprising:
   a plurality of via structures formed on the first conductive structures and the second conductive structures;
   a plurality of first wire structures formed on the via structures, the first wire structures comprising a first portion extending along the first direction; and
   at least a second wire structure comprising a first portion extending along the first direction and a second portion extending along the second direction.

5. The semiconductor IC layout structure according to claim 4, wherein the second wire structure further comprises a third portion extending along the first direction or the second direction.

6. The semiconductor IC layout structure according to claim 1, further comprising a plurality of dummy gates extending along the first direction.

* * * * *